United States Patent
Holcombe et al.

(10) Patent No.: US 7,482,666 B2
(45) Date of Patent: Jan. 27, 2009

(54) APPARATUS AND METHOD FOR OPTICAL ISOLATION

(75) Inventors: Wayne T. Holcombe, Mountain View, CA (US); Robert Gordon Farmer, Modesto, CA (US)

(73) Assignee: Silicon Laboratories Inc., Austin, TX (US)

(*) Notice: Subject to any disclaimer, the term of this patent is extended or adjusted under 35 U.S.C. 154(b) by 37 days.

(21) Appl. No.: 11/652,933

(22) Filed: Jan. 12, 2007

(65) Prior Publication Data

US 2007/0158663 A1 Jul. 12, 2007

Related U.S. Application Data

(60) Provisional application No. 60/758,483, filed on Jan. 12, 2006.

(51) Int. Cl.
*H01L 27/15* (2006.01)
*H01L 29/267* (2006.01)
*H01L 31/12* (2006.01)
*H01L 33/00* (2006.01)

(52) U.S. Cl. ............... 257/433; 257/81; 438/25

(58) Field of Classification Search ........... 257/80, 257/81, 83, 82, 98, 99, 433, 434, 437, 446, 257/461, 723, 724; 438/25, 27
See application file for complete search history.

(56) References Cited

U.S. PATENT DOCUMENTS

| | | | | |
|---|---|---|---|---|
| 4,972,089 A * | 11/1990 | Stevenson | ............... | 250/551 |
| 6,970,489 B2 * | 11/2005 | Shimonaka | ............... | 372/43.01 |
| 2002/0154667 A1 * | 10/2002 | Shimonaka | ............... | 372/50 |
| 2004/0201080 A1 * | 10/2004 | Basoor et al. | ............... | 257/666 |
| 2006/0062269 A1 * | 3/2006 | Shimonaka | ............... | 372/43.01 |
| 2006/0164817 A1 * | 7/2006 | Yoshida | ............... | 361/749 |

* cited by examiner

*Primary Examiner*—S. V Clark
(74) *Attorney, Agent, or Firm*—Francissen Patent Law, P.C.

(57) ABSTRACT

An optoisolator device is shown having a die attachment device with a planar surface. A first circuit die has first and second planar surfaces and a first side surface. A receiver circuit and a first photodiode are formed on the first planar surface of the first circuit die, where the first photodiode is electrically coupled to the receiver circuit. The second planar surface of the first circuit die is attached to the planar surface of the die attachment device. A second circuit die has a transmitter circuit that includes a first light emitting diode and is attached to the die attachment device in a position adjacent to the first side surface of the first circuit die. A clear plastic layer is formed on the planar surface of the die attachment device over the first and second circuit dies. An opaque layer may be formed over the clear plastic layer.

25 Claims, 6 Drawing Sheets

APPARATUS AND METHOD FOR OPTICAL ISOLATION

CROSS-REFERENCE TO RELATED PATENT APPLICATIONS

This patent application claims the benefit of U.S. Provisional Patent Application No. 60/758,483, filed Jan. 12, 2006.

FIELD OF THE INVENTION

This invention pertains to electrical isolation and, more particularly, to optical isolation circuits.

BACKGROUND OF THE INVENTION

For electrical safety, to allow operation with large common mode signals or for both certain types of circuits require electrical isolation between two sub-circuits. One way of implementing an isolation barrier between sub-circuits is through the use of an optical isolator or optoisolator. Another way is through the use of a transformer. These circuits often also require a signal path between the two sub-circuits.

Figure 1:
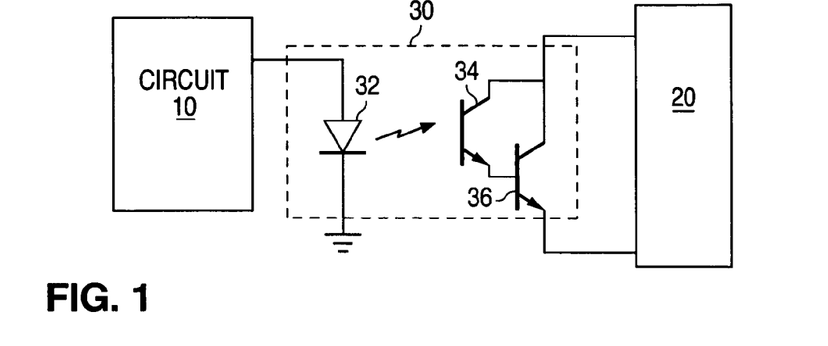
FIG. 1 is a circuit diagram illustrating an example of a conventional optoisolator circuit.

The signal path is often implemented using a conventional optoisolator, since it is usually cheaper than a transformer. FIG. 1 is a simplified circuit diagram illustrating an example of a conventional optoisolator signal path. In FIG. 1, circuits 10 and 20 are electrically isolated from one another. However, optoisolator circuit 30 provides a signal path from transmitting circuit 10 to receiving circuit 20. A signal output from transmitting circuit 10 drives light-emitting diode (LED) 32, which emits light that is received by the base of photo-transistor 34. When LED 32 is active, photo-transistor 34 will conduct current into the base of transistor 36, which amplifies the received current signal. The received signal may then be sensed by receiving circuit 20. Typically, optoisolator 30 is a standard external part that is relatively expensive.

Figure 2:
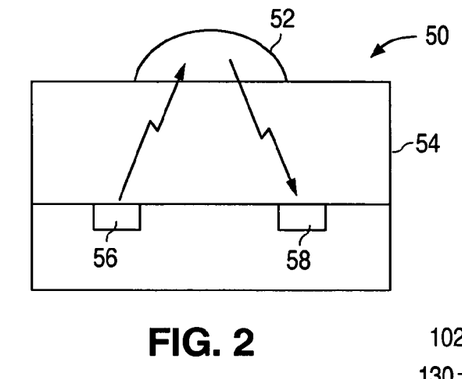
FIG. 2 is a cross-sectional view of a conventional optoisolator circuit package.

FIG. 2 is a cross-sectional view of an example of a conventional photodiode circuit 50 that includes a reflective dome 52 in the plastic packaging 54 to the circuit. The dome is molded into the package, which is typically an expensive process, and a reflective or white coating is formed over the packaging to improve the reflectance. The dome and reflective coating are utilized to improve the current transfer ratio (CTR), i.e. the ratio of the current required to drive the LED 56 versus the current generated in the receiving photodiode 58, of the optoisolator circuit. In addition to the higher cost associated with molding the dome structure, the dome structure can cause difficulties in fitting the optoisolator package into its ultimate application.

BRIEF SUMMARY OF THE INVENTION

In an embodiment of an optoisolator device, a die attachment device is provided having a planar surface. A first circuit die is provided having a substantially quadrangular shape with first and second planar surfaces and a first side surface. The first circuit die has formed thereon a receiver circuit formed substantially on the first planar surface of the first circuit die and a first photodiode formed substantially adjacent to the first side surface of the circuit die. The first photodiode is electrically coupled to the receiver circuit. The second planar surface of the first circuit die is attached to the planar surface of the die attachment device. A second circuit die is provided having a transmitter circuit that includes a first light emitting diode. The second circuit die is attached to the die attachment device in a position substantially adjacent to the first side surface of the first circuit die so that there is an optically unobstructed path from the first light emitting diode to the first photodiode. A clear plastic layer is formed on the planar surface of the die attachment device over the first and second circuit dies. In a further refinement of this embodiment, the device further includes an opaque layer formed over the clear plastic layer.

BRIEF DESCRIPTION OF THE DRAWINGS

Certain embodiments are described with reference to the following drawings, wherein.

DETAILED DESCRIPTION OF EMBODIMENTS

Even though either a transformer or optical isolation system may provide very large direct current (DC) or low frequency common mode isolation, the high frequency alternating current (AC) common mode isolation (or common mode noise immunity) will be worse due to asymmetric coupling capacitance across the isolation barrier. Typically, the unwanted signal being coupled across the isolation barrier is proportional to the product of the coupling capacitance and the dv/dt of the unwanted common mode signal.

Although optoisolators are typically cheaper than transformers and even have less capacitance by approximately a factor of 10 across the isolation barrier than transformers, because the optical gain is 1% of a typical transformer, approximately 100 times more receiver gain is required than with the transformer, effectively multiplying the capacitance coupling by a similar figure. Consequently, it is not uncommon that optoisolator systems have poorer AC common mode immunity than transformer isolation systems. In some applications requiring isolation, the AC common mode noise is so large that the AC common mode immunity of a standard optoisolator is inadequate.

As an example, an optoisolator might be used in an off-line switcher controller to send control signals across an isolation barrier. Due to the large flyback transients of the switcher, the common mode AC signal across the isolation barrier may be 300VPP with a dv/dt of 1 V/ns. If the optoisolator coupling capacitance is 400 femto farads, then a 1 V/ns dv/dt will cause 400 uA of current to flow in the receiving circuit for several hundred nano-seconds. Since a typical high speed optoisolator using a photo-diode has a 1% current transfer ratio (CTR) and if its LED might be driven with a 10 mA signal, the 1% optical receive signal would be 100 uA which is one-fourth of the signal level of the peak noise transient in this example. This is highly undesirable. Usually, for pulse systems it is desirable that transient noise be at least an order of magnitude, e.g. 10×, below the desired signal to ensure adequate margin over temperature and device variation. Consequently, in this application it would be desirable to use an optoisolator that has very low common mode capacitive coupling, perhaps less than 10 femto farads. However, it is difficult to produce an optical isolator that has adequate optical signal coupling and low capacitive coupling since these two parameters work against each other. If the LED is spaced further from the photodiode to reduce coupling capacitance, then the CTR will go down with little improvement in signal to noise. Shielding can be used, but it must be optically transparent, which is also difficult to achieve.

Furthermore, using the above off-line switcher controller example, even if the optoisolator has 0 femto farads of coupling capacitance, the receiver pins are likely to have much more than 10 femto farads of coupling capacitance to components or traces on the other side of the isolation barrier. Therefore, to prevent this stray coupling requires careful printed circuit board layout with shielding around the receiving pins connected to the optoisolator.

In the present invention, a photo-diode is integrated on the same circuit substrate or die with at least a receiving circuit. As will be discussed below, in one embodiment, the photo-diode may be fabricated on the side edge of the circuit die allowing the collection of light from either the sidewall or the top of the die. The die is encased in a clear plastic package along with the LED, which is spaced approximately 0.4 mm or more away on a separate electrically isolated structure. The clear plastic package is transparent and provides electrical insulation. An opaque film is formed over the clear plastic package to block light in order to reduce ambient light, but is not necessary in all applications. The resulting clear plastic packaging structure acts as a light guide from a light-emitting diode (LED) of the transmitting circuit to the photo-diode of the receiver circuit and provides electrical insulation between the transmitting circuit and the receiver circuit.

In one preferred embodiment, a first photo-diode is disposed on the die in order to receive a light signal from the LED while a second photo-diode is disposed on the die in order to avoid receiving the light signal from the LED. The second photo-diode is then useful for measuring an ambient light level in the package for comparison to the light signal received by the first photodiode, since in a low cost clear package it may not be possible to cheaply and completely cover the package with a light opaque material (paint) The ambient measuring diode allows less complete or even no coverage of the IC with opaque material. In another preferred embodiment, the photo-diode is a distributed photo-diode structure, such as the structures described in U.S. Pat. No. 6,198,118 or 6,753,586.

As noted above, conventional optoisolators are relatively expensive for the functionality they provide compared with modern integrated electronics. They also typically have a low level of current transfer efficiency, e.g. on the order of 1%. For example, a current in the transmit LED of 1 mA typically yields 10 µA of current in a photodiode with a light receiving area of 1 mm$^2$. Using a phototransistor increases the current transfer efficiency to approximately 100%. The base of the phototransistor collects the carriers generated in the base and collector regions by the collection of the of the light transmitted by the LED and amplifies it by the β of the first transistor, e.g. ~100, resulting in approximately a 100% current transfer ratio (CTR). A Darlington pair, such as that shown in FIG. 1, can be employed to provide further gain for the received current signal. However, phototransistors tend to suffer from slower response due to Miller capacitance and long carrier lifetimes for the photogenerated charge carriers.

Another approach (as disclosed by King in U.S. Pat. No. 4,114,177) to improve efficiency in conventional optoisolators is the use of a dome shaped reflective structure in the circuit packaging in order to increase the amount of reflected light reaching the photoreceiver, e.g. photodiode or phototransistor, from the LED, since the LED and photoreceiver are typically disposed on the same planar surface of the circuit die. The dome structure is a thick clear feature that is typically molded into the plastic packaging and then covered in a white or reflective film. The molded feature tends to be expensive and the increased size can make it difficult to fit the optoisolator into the end application, e.g. a cell phone or personal data assistant. FIG. 2 illustrates an example of a conventional optoisolator arrangement having a reflective dome.

Figure 3:
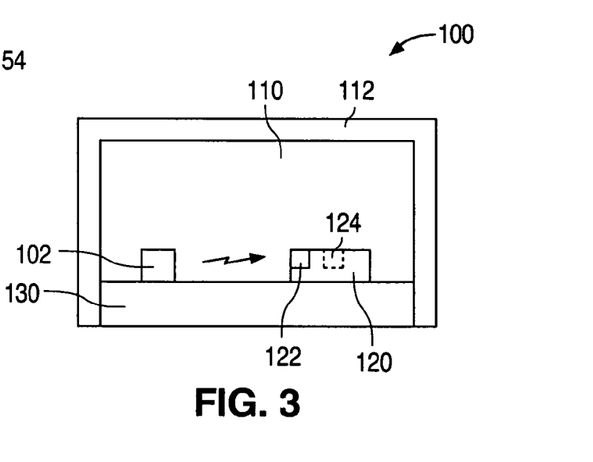
FIG. 3 is a cross-sectional view of an embodiment of an optoisolator in accordance with the present invention.

FIG. 3 illustrates an embodiment of an optoisolator 100 in accordance with the present invention. In this embodiment, an LED 112 generates a light signal in response to a current signal provided by a transmit circuit on an integrated circuit die 110. The light signal is transmitted by clear plastic packaging 132 used to package the transmit 110 and receive 120 circuits. The clear packaging 132 is covered with an opaque layer 134 that may also be reflective. A photodiode 122 that is part of a receive circuit 120 receives the light transmitted by the LED 112, which is converted to a receive signal in the receive circuit 120.

Note that LEDs tend to emit light in a lateral direction relative to the perpendicular of a planar surface of the die 110 on which the LED is fabricated. In the embodiment of FIG. 3, the photodiode 122 is fabricated on a side surface 121 of the receive circuit 120 die that is facing the LED 112. There may also be substantial levels of reflection from an opposing wall of the clear packaging 132. This arrangement may lead to greater light reception by the photodiode 122 because a high amount of the light laterally emitted by the LED 102 is received by the photodiode 122. Note that another photodiode 124 may be fabricated on another side surface of the receiver circuit 120 facing the opposing wall of the packaging 132 in order to collect the light reflected off of the opposing wall in the packaging.

The transmitter and receiver circuits are attached to a chip carrier, lead frame, printed circuit board, or other die attachment device 130. The clear plastic packaging 132 is formed in a thin layer over the transmit 110 and receiver circuit 120 dies. Optionally, the opaque coating 134 may be formed over the clear plastic packaging layer 132.

In another embodiment, two photodiodes 120, 124 are formed on the receiver circuit 120. One photodiode 120 is on the side surface 121 of the receiver circuit 120 die facing the LED 112 formed on the transmit circuit die 110. The second photodiode 124 is formed on another side of the receiver circuit 120 die so that it picks up mainly ambient light that may be present in the clear plastic packaging layer 110. FIG. 3 illustrates this option. An ambient light photodiode may be fabricated on a side of the receiver circuit that does not receive light from the LED 102. This photodiode 124 is rendered in FIG. 3 using a dotted line.

Figure 4:
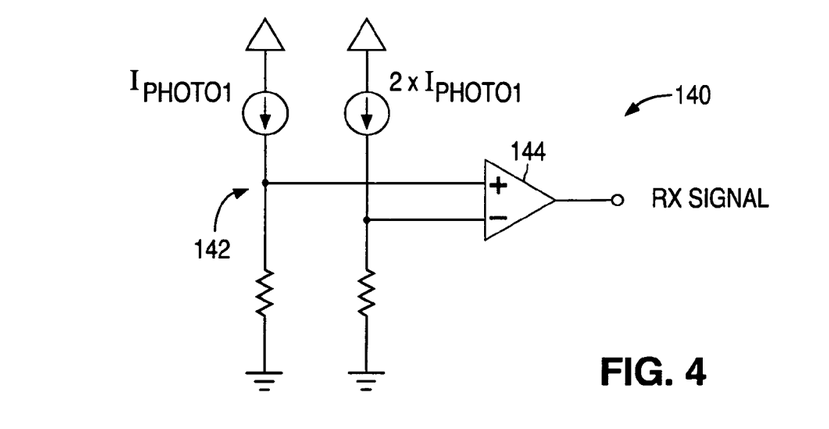
FIG. 4 is a simplified circuit diagram for the receive circuit of FIG. 3.

The current levels of the two photodiodes 120, 124 are then ratioed and compared to determine whether a transmitted signal is being received. For example, a ratio of two may be obtained by using a current mirror 142 to double the current received by second photodiode 124, which is converted to a voltage at one input of a comparator 144. The current in the first photodiode 122 is also converted to a voltage at another input of the comparator. In this example, a received current is detected when the current in the first photodiode 122 exceeds twice the current in the second photodiode 124. This is demonstrated in the simplified circuit 140 diagram of FIG. 4.

Figure 5:
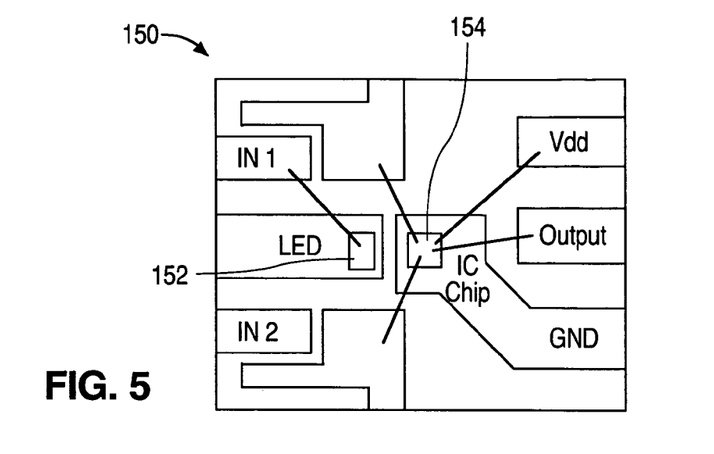
FIG. 5 is a topological view of one embodiment of an optoisolator in accordance with the present invention.
Figure 6:
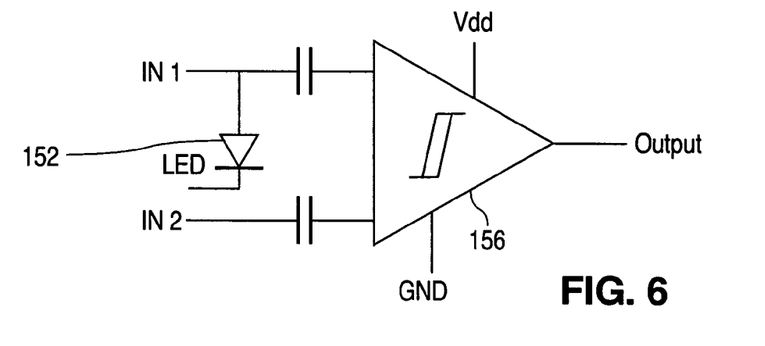
FIG. 6 is a simplified circuit diagram corresponding to the optoisolator of FIG. 5.

The photodiodes formed on the side surfaces of the receive die 120 may be similar in structure to the diodes typically used for protection from electro-static discharge (ESD). FIG. 5 is a topological diagram illustrating an embodiment of a layout for an LED 152 and a receiver circuit 154 with a photodiode or similar device in a chip carrier 150. A first input IN1 receives the signal that drives the LED 152. The receiver IC chip 154 is electrically coupled to two traces, one that is adjacent to input IN1 and the other adjacent to a second input IN2. The receiver circuit includes a comparator 156 that has inputs that are coupled to these traces so that there is capacitive coupling between inputs IN1 and IN2 and the inputs of the comparator 156. The result is illustrated in the simplified circuit of FIG. 6. Note that the receiver circuit 154 includes a photodiode that collects the light transmitted by the LED 152 for input to the comparator 156.

Figure 7:
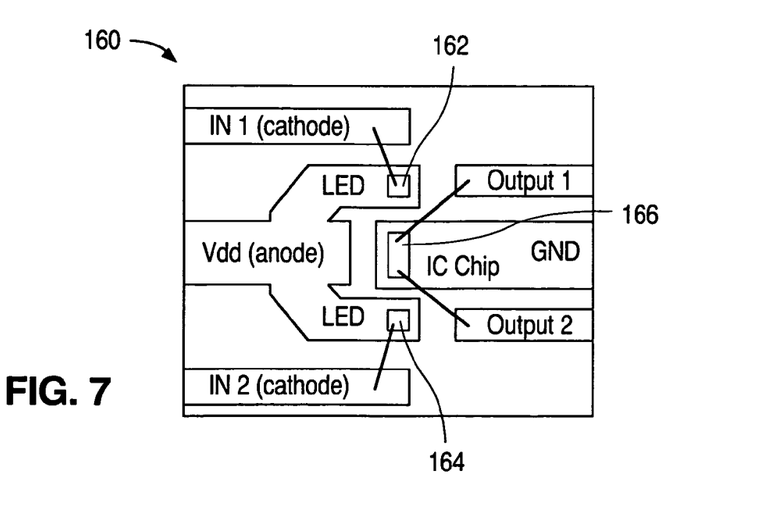
FIG. 7 is a topological view of another embodiment of an optoisolator in accordance with the present invention.
Figure 8:
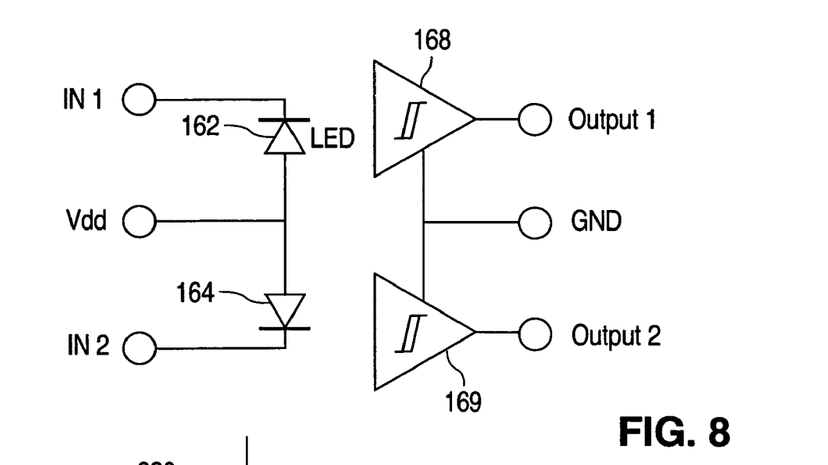
FIG. 8 is a simplified circuit diagram corresponding to the optoisolator of FIG. 7.

FIG. 7 illustrates another embodiment of an optoisolator that provides for multiple optical channels. Two LEDs 162 and 164 are provided, one driven by a signal applied to input IN1 and the other driven by a signal applied to input IN2. A receiver IC chip 166 has photodiodes fabricated on two sides, one facing the LED 162 driven by IN1 and the other facing the LED 164 driven by IN2 to provide two optical channels. Two comparators are fabricated in the receiver circuit 166 and each is coupled to a photodiode in order to receive the signals generated by LEDs 162 and 164. The receiver circuit 166 has two outputs OUTPUT1 and OUTPUT2 for outputting the signals received via the LEDs 162, 164. FIG. 8 is simplified circuit diagram corresponding to FIG. 7 illustrating the two optical channels. Comparator 168 receives the optical signal from LED 162 and comparator 169 receives the optical signal from LED 164.

In other embodiments, three or four photodiodes may be formed on a receiver circuit, one of each of the receiving circuit's three or four sides. This allows up to three independent optical channels. The remaining one or two sides may be used to measure background ambient light to correct for ambient light collected by the receiving diodes on two or three sides.

Figure 9:
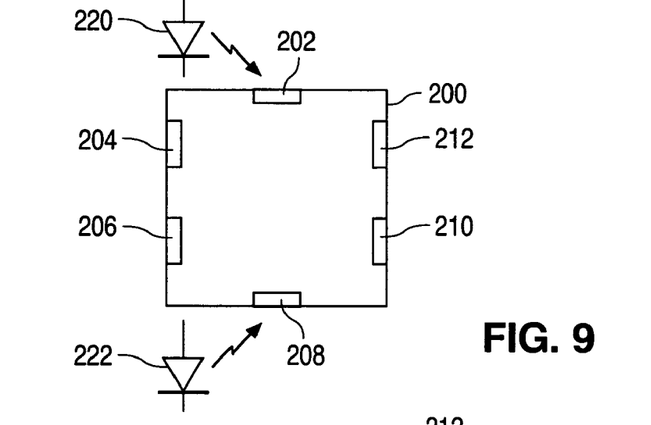
FIG. 9 is a topological view of still another embodiment of an optoisolator in accordance with the present invention.
Figure 10:
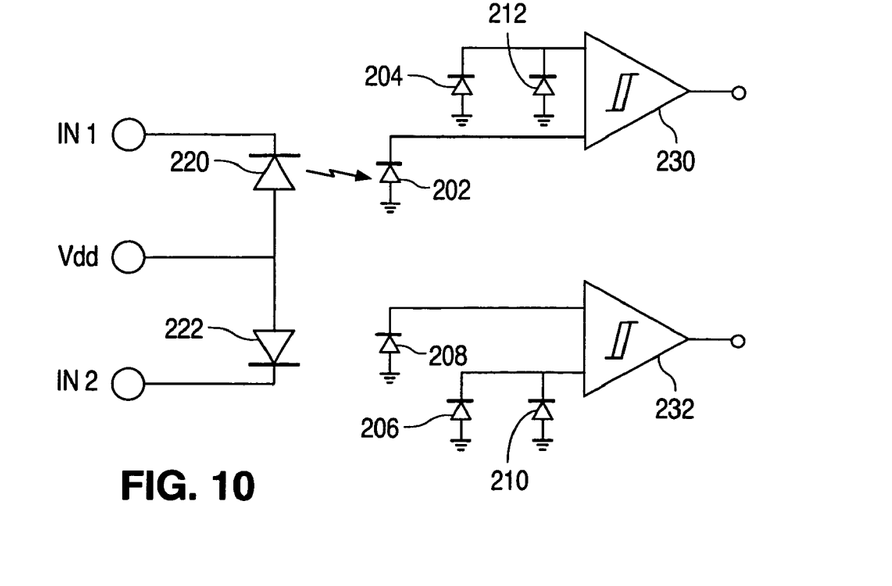
FIG. 10 is a simplified circuit diagram corresponding to the optoisolator of FIG. 9.

FIGS. 9 and 10 illustrate an embodiment of an optoisolator having two optical channels and two ambient photodiodes for each channel. A first receive photodiode 202 is fabricated on a side of a receiver circuit chip 200 facing a first LED 220. Two ambient photodiodes 204 and 212 are fabricated on left and right sides of the chip 200 that are not facing the first LED 220 and are used to measure the ambient light in the package for chip 200. Likewise, a second channel includes a second receive photodiode 208 facing a second LED 222 and two more ambient photodiodes 206 and 210. The ambient photodiodes 204, 206, 210, 212 are used to adjust the detect threshold of the receive comparators 230 and 232 so that a light signal from the transmit LEDs 220, 222 may be differentiated from the background light level within the optoisolator package. FIG. 10 is a simplified circuit diagram illustrating the resulting circuit, where the ambient photodiodes 204, 206, 210, 212 are coupled into one input of the comparator 230, 232 for each channel and the receive photodiode 202, 208 is coupled into the other input of the comparator 230, 232 for the given channel.

Having a second reference ambient photodiode to compare against one of more signal photodiodes may also permit a complete differential receiver design. Such a common circuit technique is useful against power supply, substrate noise (common in switching supplies), and other common mode noise sources, which is helpful to obtain high levels of gain with small receiving diodes. However, a differential receiver won't necessarily provide good immunity against any common mode noise unless the signal source impedance is balanced at all frequencies. This is best accomplished by using two identical diodes. Consequently, it can be seen that there are several benefits to using an identical ambient reference diode as the signal diode. Either a single or multiple ambient reference diodes may be used to achieve these various noise and ambient canceling functions.

In another enhancement where the ambient reference canceling diode may not output an ambient canceling signal representative of the signal diode ambient due to packaging optical characteristics, a gyrator circuit that removes DC ambient signals may be used similar to that used in some IrDA transceivers to allow detection of signal pulses that are as little as $1/10,000$ of the background ambient. For an example of a gyrator circuit, see U.S. Pat. No. 6,360,090, herein incorporated by reference in its entirety. Or, where it is not practical to put a reference canceling diode on the side of the receiving IC, the gyrator circuit may be used to allow pulse detection despite large signal ambients.

In yet another enhancement, automatic gain control (AGC) can be applied to the receiving photodiode signal to provide signal quieting or improved noise immunity against both optical and electrical noise sources. For an example of an AGC circuit, see U.S. Pat. No. 6,240,283, herein incorporated by reference in its entirety. The AGC allows the user to adjust the LED drive to a level that provides good noise immunity. In other words, the stronger the receive signal, the lower the sensitivity. The AGC circuit works by adjusting the receive threshold to be one half of the peak signal level. Consequently, any noise signals less than one-half the peak signal will not be detected or cause disruption of a valid signal. By raising the signal and improving the signal to noise, the noise immunity is also increased. Typically, the AGC has a decay time longer than the maximum period between pulses.

In yet another enhancement, the optical receiver can qualify receiving pulses by requiring fast edge optical pulses, rejecting pulses with more than 1-2 us rise and fall times in order to prevent triggering the receiver by optical noise arising from fluorescent light source with electronic switching inverters.

Further, a dotted or distributed PN photo-diode structure, such as the one shown in U.S. Pat. No. 6,198,118, herein incorporated by reference, may be utilized to improve immunity to electro-magnetic interference (EMI) and increase the optical signal to noise ratio. The distributed PN photodiode structure offers lower capacitance and, if the substrate upon which the distributed photodiode is formed is grounded, the substrate for the circuit will act as a shield. In addition, the lower capacitance of the dotted structure reduces equivalent input current noise due to input noise voltage of the photodiode transconductance amplifier. The resultant lower noise allows higher gain or sensitivity, in turn allowing use of less efficient and lower cost LEDs and allowing very low current transfer ratios (CTRs), as little as 0.001%, which may arise as a consequence of the low cost clear packaging. Also, a metal shield trace may be formed across the photodiode junction because the individual dots of the distributed photodiode structure can operate by collecting photo-generated charge carriers that are created by light penetrating into the grounded substrate and migrating to the photodiode junctions. In this embodiment, the substrate is conductive and therefore blocks external EMI fields thereby completely shielding the carriers within the substrate reducing the signal coupling capacitance to the components on the other side of the isolation barrier to less than 1 femto farad. Note that the photo-generated charge carriers may also diffuse along a diffusion gradient of the substrate as well as through thermal activity. Additional shielding may be especially useful in off-line switchers, because the receiving signal IC substrate and supplies and all signals may be moving at high dv/dt, capacitances to any nodes on the other side of the isolation barrier may couple into the receiver pins even if there is no coupling across the isolation signal path. Therefore, by integrating a shielded optical receiver on the IC, common mode noise coupling from other sources is reduced.

Therefore, the combination of side edge multiple dotted photodiodes, differential amplifiers, all integrated with a signal processing IC receiver, in combination with an LED separated by the insulating barrier formed by the clear packaging material provides many benefits not immediately apparent due to complex noise and cost issues. The common mode immunity of this optical signal coupling invention is especially useful when used to send switching control signals across an isolation barrier in switching supplies or any other circuitry requiring very high common mode AC immunity. In addition, it may be beneficial to include other components in the common package, these being switching transistors and the LED driver controller IC, etc.

In another embodiment, a small optoisolator receiver can be fabricated on a CMOS, BiCMOS, or Bipolar IC process, where the optoisolator may be less than 1/10 the size of a typical optical isolator photodiode, phototransistor, or photo-Darlington. This circuit has one or more signal edge side diodes, one or more ambient reference diodes, a set of transistor mirrors that ratio the current from the signal and reference diodes, amplifier transistors and threshold circuits. This circuit can be self-powered directly from its load, so that when it is enabled, it acts like a Darlington optoisolator with a CTR of 10-100 and with similar on and off characteristics. Although the IC fabrication process may be 2-3 times more expensive than the photodiode, phototransistor, or photoDarlington process, because the IC is more than 10× smaller, the total cost of silicon is reduced. In addition, this IC can be placed in the lower cost clear package that is both less expensive and smaller than the standard domed optoisolator package. Consequently, this produces a lower cost and smaller package optoisolator to replace existing optoisolators.

Figure 11:
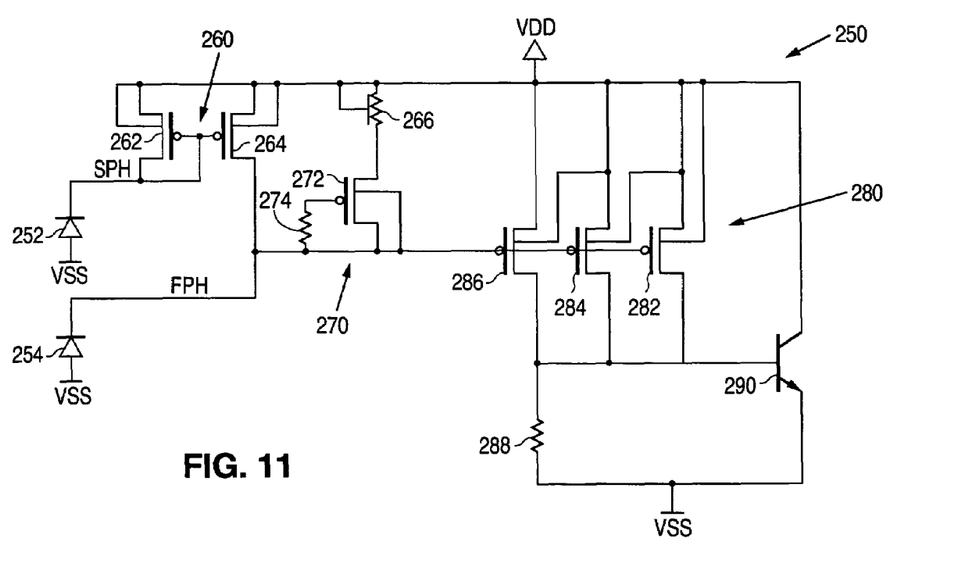
FIG. 11 is a circuit diagram for an embodiment of a receiver circuit suitable for application of the present invention that utilizes a Darlington configuration.

FIG. 11 illustrates one embodiment of such a Darlington replacement circuit 250. A first photodiode 252 provides an ambient input signal SPH into a current mirror 260, where photodiode 252 is coupled in series with transistor 262 of current mirror 260. Another transistor 264 of current mirror 260 is coupled in series with a second photodiode 254 that provides a received input signal FPH. When the current of the received input signal FPH is greater than the current of the ambient input signal SPH, as scaled by the current mirror 260, then the input of a current source 270 is pulled low by FPH, e.g. a gate of transistor 272 that receives the signal FPH via a resistor 274, and provides current to the input of a high current mirror 280, e.g. the gates of transistors 282, 284, 286. The high current mirror 280 sources current to the base of a bipolar transistor 290 in order to obtain high CTR for the circuit and equivalent Darlington performance.

In another enhancement, the above optoisolator can be modified to have a separate power pin to allow higher speed operation than the self-powered version to replace digital optoisolators.

In another enhancement, the above optoisolator can be modified to provide a dual optoisolator function that can share the ambient reference correction photodiode. Due to the low IO pin count and small die size, it is more silicon efficient per channel to put two optoisolators on a die than one.

In another enhancement, the side edge signal diode and ambient correct diode can be used to drive any number of common optoisolator devices to allow packaging these components in lower cost clear non-domed optical packages with optional opaque covering, including optical triacs, SCRs, solid state relays constructed from photovoltaic stack driver ICs and MOS transistors, etc.

Figure 12:
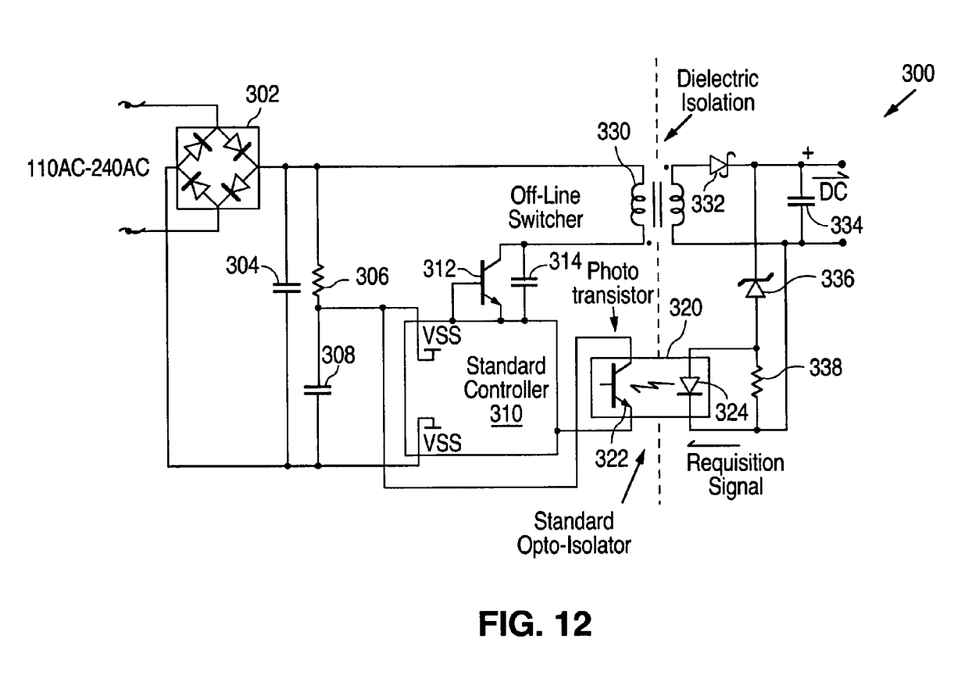
FIG. 12 is a circuit diagram for an example of a conventional off-line controller having a controller and separate conventional optoisolator.

The present invention permits additional functionality to be integrated into an optoisolator circuit, such as integrating an off-line switch controller into an optoisolator. FIG. 12 is a circuit diagram for an example of a conventional off-line controller having a controller and separate conventional optoisolator. In the conventional off-line power regulator circuit 300, alternating current line power passes through a rectifier circuit 302, which provides direct current (DC) power to a transformer 330. Transformer 330 is used to pass power across a dialectric isolation barrier to provide DC power to the isolated or off-line side. The amount of current through transformer 330 is controlled by a standard controller 310 that receives a feedback signal from the off-line side through a standard opto-isolator 320. In this conventional example, the controller 310 and optoisolator 320 are separate devices that are not integrated into a signal optoisolator device.

Figure 13:
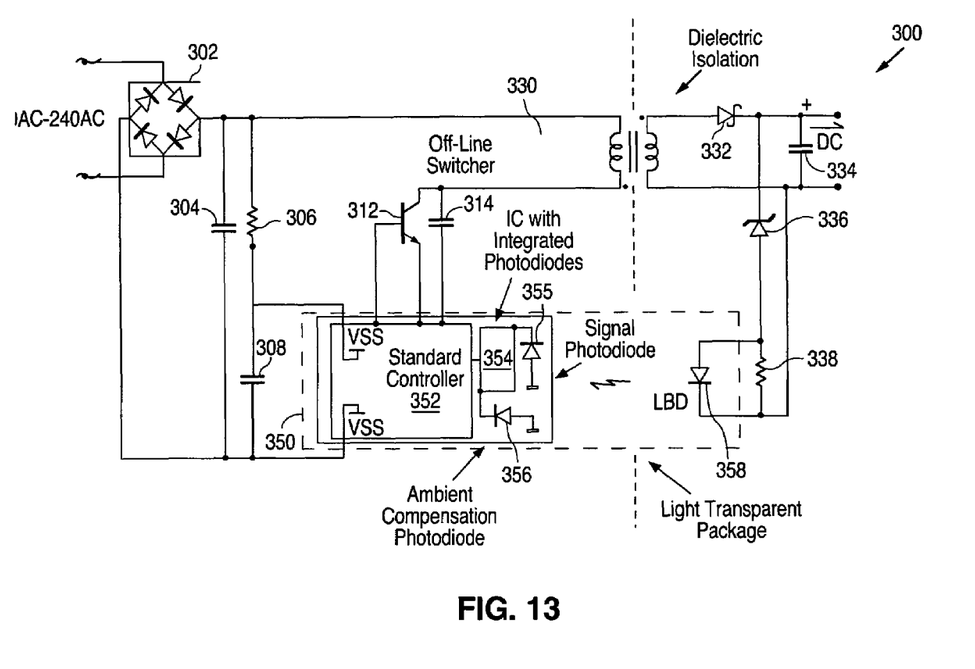
FIG. 13 is a circuit diagram for an embodiment of an optoisolator having a controller integrated with receiver in accordance with the present invention.

FIG. 13 is a circuit diagram for an embodiment of an off-line controller having a controller integrated with an optoisolator in accordance with the present invention. In the present invention, it is possible to integrate the controller function on the same circuit die as the photodiode receiver. For example, a controller may be fabricated on die 120 of FIG. 3. In the circuit of FIG. 13, an optoisolator device 350 is provided wherein a controller 352 is fabricated on the die with a receiver circuit 354 that recovers a signal from signal photodiode 355. In this exemplary embodiment, an ambient light photodiode 356 is provided so that the receiver circuit 354 can distinguish a light signal from LED 358 from an ambient light level in optoisolator device 350. Typically, the controller function of controller 352 may be integrated into the receive side circuit of optoisolator 350 with little or no additional die area required. Other types of functionality, such as a data receiver controller, may be integrated into other embodiments of an optoisolator in accordance with the present invention.

In an alternative embodiment, a controller is provided on a separate die that is attached to the same package as the receiver circuit. For example, a circuit die containing a controller circuit may be attached to the die attachment device 130 of FIG. 3 and electrically coupled to the receive circuit die 120. The transmit die 102, receive die 120 and controller die are then encapsulated in the clear plastic layer 110 and an opaque layer 112, as discussed above, to create an optoisolator device with controller functionality. External interface pins are provided on the die attachment device 130 for the controller die to be attached to circuit elements outside of the optoisolator device.

Note that while the use of photodiodes is generally discussed herein, other devices, such as phototransistors, may be employed as well.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An optoisolator device, the device comprising:
a die attachment device having a planar surface;
a first circuit die having a substantially quadrangular shape with first and second planar surfaces and a first side surface, the first circuit die having a receiver circuit formed substantially on the first planar surface of the first circuit die and a first photodiode formed adjacent to the first side surface of the circuit die and electrically coupled to the receiver circuit, where the second planar surface of the first circuit die is attached to the planar surface of the die attachment device;
a second circuit die having a transmitter circuit that includes a first light emitting diode, where the second circuit die is attached to the die attachment device in a position substantially adjacent to the first side surface of the first circuit die so that there is an optically unobstructed path from the first light emitting diode to the first photodiode; and
a clear plastic layer formed on the planar surface of the die attachment device over the first and second circuit dies.

2. The optoisolator device of claim 1, the device further including an opaque layer formed over the clear plastic layer.

3. The optoisolator device of claim 1, wherein:
the first circuit die includes a second side surface and a second photodiode formed adjacent to the second side surface, where the second side surface is oriented to receive reflected light from the first light emitting diode and the receiver circuit is configured to combine the light signal received from the first and second photodiodes in order to receive a signal from the transmitter.

4. The optoisolator device of claim 1, wherein:
the first circuit die includes a second side surface and a second photodiode formed on the second side surface, where the second side surface is oriented to receive an ambient light within the plastic layer and the receiver circuit is configured to compare the light signal received from the first and second photodiodes in order to receive a signal from the transmitter circuit.

5. The optoisolator device of claim 1, wherein the receiver circuit includes a current mirror coupled to the first photodiode.

6. The optoisolator device of claim 1, wherein:
the first circuit die includes a second side surface and a second photodiode formed on the second side surface; and
the device includes a third circuit die that includes a second light emitting diode, where the third circuit die is attached to the die attachment device in a position substantially adjacent to the second side surface of the first circuit die so that there is an optically unobstructed path from the second light emitting diode to the second photodiode.

7. The optoisolator device of claim 6, where the receiver circuit is configured to compare the light signal received from the first and second photodiodes in order to receive a signal from the transmitter circuit.

8. The optoisolator device of claim 6, where the receiver circuit is configured to receive a first light signal from the first photodiode in order to receive a first signal from the transmitter circuit and receive a second light signal from the second photodiode in order to receive a second signal from the transmitter circuit.

9. The optoisolator device of claim 6, wherein the receiver circuit includes a first current mirror coupled to the first photodiode and a second current mirror coupled to the second photodiode.

10. The optoisolator device of claim 1, wherein the first circuit die includes a controller circuit electrically coupled to the receiver circuit.

11. The optoisolator device of claim 1, the device further including a third circuit die having a controller circuit formed thereon, where the third circuit die is attached to the die attachment device and the controller circuit is electrically coupled to the receiver circuit of the first circuit die.

12. A method optical isolation, the method comprising the steps of:
providing a die attachment device having a planar surface;
providing a first circuit die having a substantially quadrangular shape with first and second planar surfaces and a first side surface;
forming a receiver circuit on the first planar surface of the first circuit die and a first photodiode adjacent to the first side surface of the first circuit die, where the first photodiode is electrically coupled to the receiver circuit;
attaching the second planar surface of the first circuit die to the planar surface of the die attachment device;
providing a second circuit die;
forming a transmitter circuit on the second circuit die that includes a first light emitting diode;
attaching the second circuit die to the planar surface of the die attachment device in a position substantially adjacent to the first side surface of the first circuit die so that there is an optically unobstructed path from the first light emitting diode to the first photodiode;
forming a clear plastic layer on the planar surface of the die attachment device over the first and second circuit dies; and
forming an opaque layer over the clear plastic layer.

13. The method of claim 12, wherein:
the step of providing a first circuit die further comprises providing the first circuit die with a second side surface;

the step of forming a receiver circuit further includes forming a second photodiode adjacent to the second side surface and configuring the receiver circuit to combine the light signal received from the first and second photodiodes in order to receive a signal from the transmitter circuit; and the step of attaching the second planar surface of the first circuit die to the planar surface of the die attachment device further comprises the step of attaching the second planar surface of the first circuit die to the planar surface of the die attachment device in a position where the second side surface is oriented to receive reflected light from the first light emitting diode.

14. The method of claim 12, where the step of forming a receiver circuit on the first planar surface of the first circuit die includes forming a current mirror in the receiver circuit that is electrically coupled to the first photodiode.

15. The method of claim 12, wherein:

the step of providing a first circuit die further comprises providing the first circuit die with a second side surface;

the step of forming a receiver circuit further includes forming a second photodiode on the second side surface and configuring the receiver circuit compare the light signal received from the first and second photodiodes in order to receive a signal from the transmitter circuit; and the step of attaching the second planar surface of the first circuit die to the planar surface of the die attachment device further comprises the step of attaching the second planar surface of the first circuit die to the planar surface of the die attachment device in a position where the second side surface is oriented to receive an ambient light level within the plastic layer.

16. The method of claim 15, where the step of forming a receiver circuit further includes forming a first current mirror in the receiver circuit that is electrically coupled to the first photodiode and forming a second current mirror in the receiver circuit that is electrically coupled to the second photodiode.

17. The method of claim 12, wherein:

the step of providing a first circuit die further comprises providing the first circuit die with a second side surface;

the step of forming a receiver circuit further includes forming a second photodiode adjacent to the second side surface; and the method includes the steps of:

providing a third circuit die that includes a second light emitting diode; and attaching the third circuit die to the die attachment device in a position substantially adjacent to the second side surface of the first circuit die so that there is an optically unobstructed path from the second light emitting diode to the second photodiode.

18. The method of claim 17, where the step of forming a receiver circuit further includes configuring the receiver circuit to receive a first light signal from the first photodiode and receive a second light signal from the second photodiode.

19. The method of claim 17, where the step of forming a receiver circuit further includes configuring the receiver circuit to compare the light signal received from the first and second photodiodes in order to receive a signal from the transmitter circuit.

20. The method of claim 12, where the step of forming a receiver circuit on the first planar surface of the first circuit die further includes forming a controller circuit that is electrically coupled to the receiver circuit.

21. The method of claim 12, where the method includes the steps of:

forming a controller circuit on a third circuit die;

attaching the third circuit die to the planar surface of the die attachment device; and electrically coupled the controller circuit to the receiver circuit.

22. An optical isolation communication device, the device comprising:

first light transmitting means for transmitting a first light signal;

light receiving means for receiving the first light signal, where the light receiving means includes a first photodiode configured to receive light in a lateral plane;

die attachment means for attaching the first light transmitting means and the light receiving means on a planar surface of the die attachment means so that light from the first light transmitting means can be received by the light receiving means;

transparent insulation means for covering the first light transmitting means, the light receiving means and the die attachment means.

23. The optical isolation communication device of claim 22, the device further including light blocking means for reducing ambient light from entering the transparent insulation means.

24. The optical isolation communication device of claim 22, where:

the device further includes second light transmitting means for transmitting a second light signal; and the light receiving means includes a second photodiode configured to receive the second light signal.

25. The optical isolation communication device of claim 22, where the light receiving means includes a second photodiode for receiving an ambient light signal and the light receiving means is configured to compare the light signal received from the first and second photodiodes in order to receive a signal from the first light transmitting means.

* * * * *